US009933489B2

United States Patent
Iino et al.

(10) Patent No.: US 9,933,489 B2
(45) Date of Patent: Apr. 3, 2018

(54) BATTERY MONITORING APPARATUS

(71) Applicant: DENSO CORPORATION, Kariya, Aichi-pref. (JP)

(72) Inventors: Junichi Iino, Kariya (JP); Tomomichi Mizoguchi, Inazawa (JP); Ryotaro Miura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 226 days.

(21) Appl. No.: 14/842,108

(22) Filed: Sep. 1, 2015

(65) Prior Publication Data

US 2016/0061909 A1    Mar. 3, 2016

(30) Foreign Application Priority Data

Sep. 1, 2014   (JP) ................. 2014-176813

(51) Int. Cl.
  *G01N 27/416*   (2006.01)
  *H02J 7/00*    (2006.01)
  *G01R 31/36*   (2006.01)
  *G01R 31/02*   (2006.01)
  *G01R 31/04*   (2006.01)

(52) U.S. Cl.
  CPC ......... *G01R 31/362* (2013.01); *G01R 31/024* (2013.01); *G01R 31/3658* (2013.01); *G01R 31/04* (2013.01)

(58) Field of Classification Search
  CPC . G01R 31/024; G01R 31/362; G01R 31/3658
  USPC .................................. 324/432, 434
  See application file for complete search history.

(56) References Cited

U.S. PATENT DOCUMENTS

| 2010/0134069 A1* | 6/2010 | Oosawa ................ H02J 7/0021 320/118 |
| 2012/0194135 A1* | 8/2012 | Mizoguchi ......... G01R 31/3658 320/118 |
| 2014/0272497 A1* | 9/2014 | Biskup ................ H01M 10/482 429/90 |

FOREIGN PATENT DOCUMENTS

| JP | 2002-168928 A |   | 6/2002 |
| JP | 2002168928 A  | * | 6/2002 |
| JP | 2011-075504 A |   | 4/2011 |
| JP | 2012100411 A  |   | 5/2012 |
| JP | 2014-090635 A |   | 5/2014 |
| JP | 2014090635 A  | * | 5/2014 |
| JP | 2014-102127 A |   | 6/2014 |

* cited by examiner

Primary Examiner — David V Henze-Gongola
(74) Attorney, Agent, or Firm — Oliff PLC

(57) ABSTRACT

A battery monitoring apparatus includes wire sections each connected to a node of corresponding adjacent two of the unit cells of a battery pack at one end thereof, and branched into a first branch section and a second branch section at another end thereof. Each of the first and second branch sections is constituted of a positive part connected to a positive electrode of the corresponding unit cell and a negative part connected to a negative electrode of the corresponding unit cell. The battery monitoring apparatus includes an equalizing switch provided between each of the first wire pairs, and a voltage detector to detect a voltage between each first wire pair, and an equalizing section which performs an equalizing process to equalize a terminal voltage of each unit cell by turning on the corresponding equalizing switch depending on a result of voltage detection by the voltage detector.

6 Claims, 4 Drawing Sheets

BATTERY MONITORING APPARATUS

This application claims priority to Japanese Patent Application No. 2014-176813 filed on Sep. 1, 2014, the entire contents of which are hereby incorporated by reference.

BACKGROUND OF THE INVENTION

1. Field of the Invention

The present invention relates to a battery monitoring apparatus for monitoring the states of unit cells constituting a battery pack.

2. Description of Related Art

The voltages of unit cells constituting a battery pack may vary from one another due to repetition of charge and discharge. In this case, unit cells undergoing overcharge or overdischarge may be damaged.

Accordingly, it is common that such a battery pack is provided with a battery monitoring apparatus for monitoring the states of the unit cells constituting the battery pack. The battery monitoring apparatus is connected with the unit cells through wires and connectors to measure the terminal voltage of each unit cell from the voltage between a corresponding adjacent two of the wires.

The battery monitoring apparatus includes an equalizing unit constituted of equalizer switches and resistors for discharging each of the unit cells by short-circuiting the corresponding adjacent wires. The equalizing unit discharge a unit cell whose terminal battery is excessively high to remove the variation in terminal voltage among the unit cells.

However, the wires and the connectors which connect the battery pack to the battery monitoring apparatus deteriorate after long time use due to repetition of voltage measurement and equalization, or after long time non-use. If the wires or connectors deteriorate, since their electrical resistance increases, the accuracy at which the voltage measurement or equalization is performed may be adversely affected.

SUMMARY

An exemplary embodiment provides a battery monitoring apparatus for a battery pack including a plurality of unit cells connected in series, including:

a plurality of wire sections each of which is connected to a node between a corresponding adjacent two of the unit cells at one end thereof, and branched into a first branch section and a second branch section at another end thereof, each of the first and second branch sections being constituted of a positive part connected to a positive electrode of a corresponding one of the unit cells and a negative part connected to a negative electrode of the corresponding one of the unit cells, for each of the wire sections, the positive part of the second branch section and the negative part of the first branch section constitute a first wire pair, and the positive part of the first branch section and the negative part of the second branch section constitute a second wire pair;

an equalizing switch provided between each of the first wire pairs to short-circuit the first wire pair when being turned on;

a first voltage detector provided in parallel to each of the equalizing switches to detect a voltage between a corresponding one of the first wire pair;

an equalizing section which performs an equalizing process to equalize a terminal voltage of each unit cell by turning on a corresponding one of the equalizing switches depending on a result of voltage detection by the first voltage detector; and a second voltage detector provided between each of the second wire pairs for detecting the terminal voltage of a corresponding one of the unit cells when the equalizing switch is on and when the equalizing switch is off.

According to the exemplary embodiment, there is provided a battery monitoring apparatus for a battery pack, which is capable of detecting the state of each of wire sections thereof that connect between the battery pack and the battery monitoring apparatus.

Other advantages and features of the invention will become apparent from the following description including the drawings and claims.

PREFERRED EMBODIMENTS OF THE INVENTION

Figure 1:
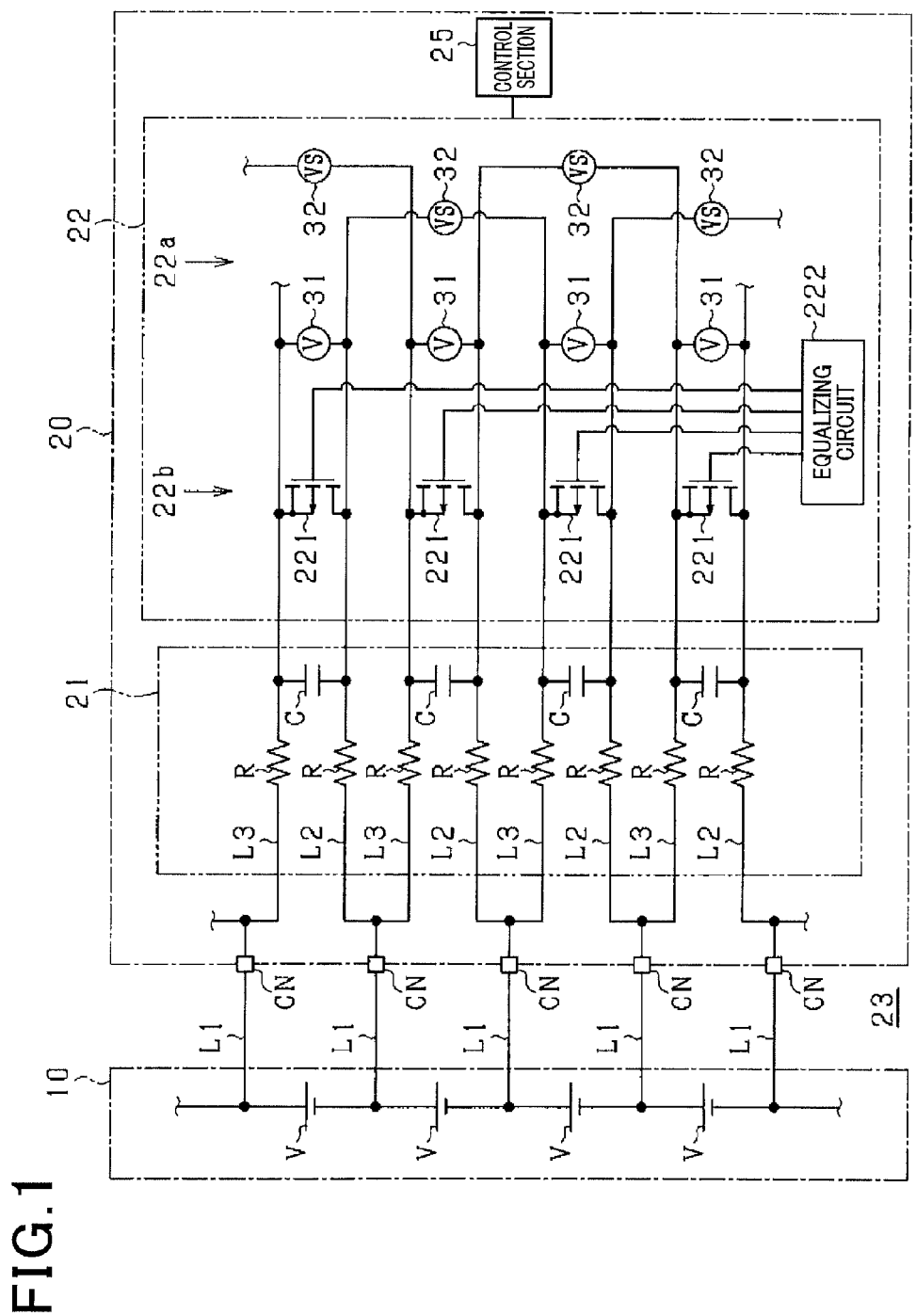
FIG. 1 is a diagram showing the electrical structures of a battery pack and a battery monitoring apparatus according to an embodiment of the invention.

FIG. 1 is a diagram showing the structures of a battery pack 10 and a battery monitoring apparatus 20 according to an embodiment of the invention.

The battery pack 10, which includes unit cells V connected in series, is used as a high voltage battery for a vehicle. The unit cell V is a rechargeable battery such as a lithium ion battery or a nickel-metal hydride battery. The unit cell V may be either a single battery or a plurality of batteries connected in series as one battery group.

The battery monitoring apparatus 20 is connected with the respective unit cells V through connection paths 23 each constituted of a wire L1 and a connector CN.

The wire L1 is connected to a node of adjacent two of the unit cells V at one end thereof and branched into branch lines L2 and L3 at the other end thereof. The branch lines L2 and L3 are connected to a later-described monitoring IC 22 of the battery monitoring apparatus 2. Branching the wire L1 into the plurality of the branch lines L2 and L3 makes it possible that each of the nodes of the unit cells V is provided with a plurality of different paths. The plurality of the different paths can be used for different functions of the battery monitoring apparatus 20.

The battery monitoring apparatus 20 includes a filter circuit 21, the monitoring IC 22, and a control section 25. The battery monitoring apparatus 20 performs a voltage detecting process for detecting the terminal voltage (the voltage across the positive and negative electrodes) of each unit cell V, an equalizing process for removing variation in terminal voltage among the unit cells V, and a resistance detecting process for detecting the resistance of each connection path 23 constituted of the wire L1 and the connector CN and connecting the positive and negative electrodes of the unit cell V to the battery monitoring apparatus 20.

The filter circuit 21 includes, for each unit cell V, a first wire pair of the branch line L3 of the positive-side wire L1 and the branch line L2 of the negative-side wire L1, a second wire pair of the branch line L2 of the positive-side wire L1 and the branch line L3 of the negative-side wire L1, a capacitor C connected between the first wire pair, and a resistor R provided for each of the branch lines L2 and L3. The resistor R serves as a filtering resistor when the voltage detecting process is performed, and serves as a current restricting resistor when the equalizing process is performed. The capacitor C is provided for each of the unit cells V.

The monitoring IC 22 includes a voltage detecting section 22a for detecting the cell voltage (terminal voltage) of each unit cell V, and an equalizing section 22b for equalizing the cell voltages.

The equalizing section 22b includes an equalizing switch 221 formed of a MOSFET or the like provided between each first wire pair, and an equalizing circuit 222 for turning on and off the equalizing switches 221. The equalizing switch 221 is parallel-connected to the capacitor C and the unit cell V.

The voltage detecting section 22a, which is parallel-connected to the corresponding unit cell V, includes a first voltage detector 31 and a second voltage detector 32. The first voltage detector 31 is connected between the first wire pair. That is, the first voltage detector 31 is connected between the branch line L3 of the positive electrode side and the branch line L2 of the negative electrode side of the same unit cell V. The second voltage detector 32 is connected between the second wire pair. That is, the second voltage detector 32 is connected between the branch line L2 of the positive electrode side and the branch line L3 of the negative electrode side of the same unit cell V. Accordingly, the voltage detecting section 22a can detect the terminal voltage of the unit cell V using different paths of the first and second voltage detectors 31 and 32. The first voltage detector 31 is parallel-connected to the capacitor C and the equalizing switch 221.

The control section 25 is formed of a microcomputer including a CPU, a ROM, a RAM, and a rewritable flash memory. the control section 25 performs the voltage detecting process, the equalizing process, and the resistance detecting process in accordance with programs stored in the ROM.

In the voltage detecting process, the first voltage detector 31 is used to obtain the terminal voltage of each unit cell V. In the equalizing process, the unit cell V which should be discharged is determined based on the results of detection of the terminal voltages of the unit cells V, and the determined unit cell V is discharged by turning on the corresponding equalizing switch 221 to thereby equalize the terminal voltages of the unit cells V.

In the resistor detecting process, the second voltage detector 32 is used to obtain the terminal voltage of each unit cell V. In the following, the resistor detecting process is explained in detail. The battery pack 10 and the battery monitoring apparatus 20 are connected to each other through the connection paths 23 each formed of the wire L1 and the connector CN as described above. The resistances of the wire L1 and the connector CN may change (increase generally) after long time use due to repetition of voltage measurement and equalization or after long time non-use.

Figure 2:
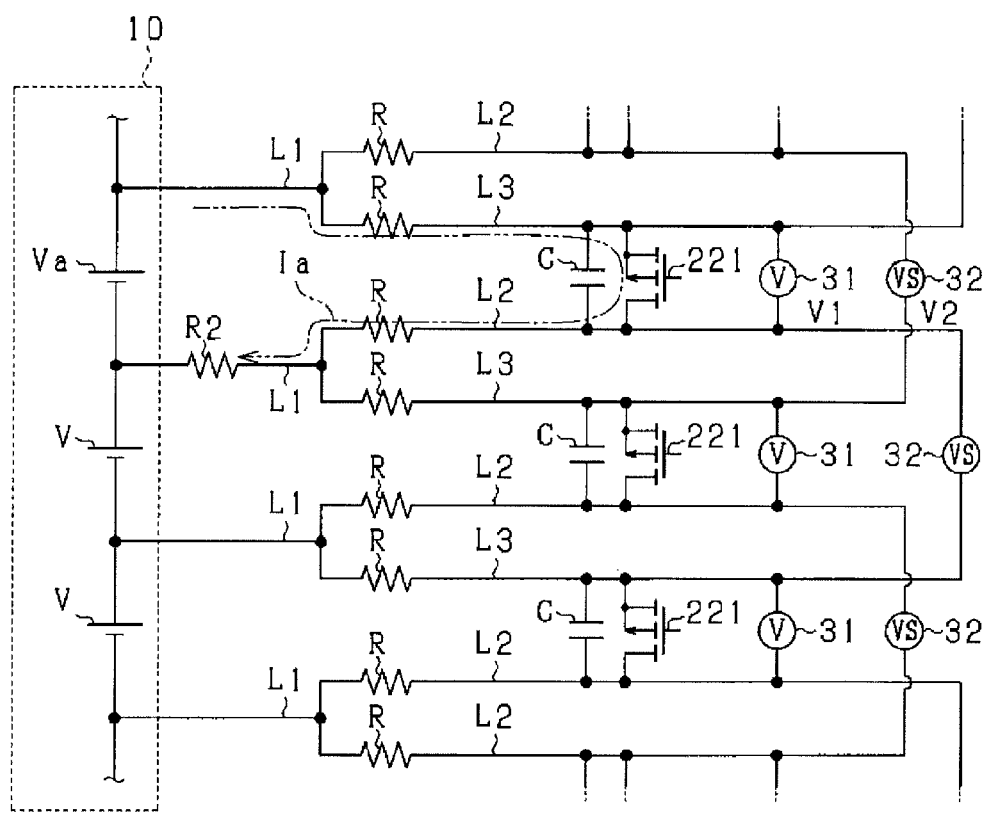
FIG. 2 is a diagram for explaining the operation of the battery monitoring apparatus.

Here, it is assumed that the resistance of the wire L1 of the negative electrode side of the unit cell Va shown in FIG. 2 has increased from the normal value of approximately $0\Omega$ to R2 ($=2\,k\Omega$) due to deterioration. The increased resistance R2 of the first wire L1 may affect the accuracy of the voltage detecting process and the equalizing process.

The resistance of the connection path 23 of each unit cell V can be detected by passing a current to the corresponding connection path 23 to produce a voltage drop. Accordingly, in this embodiment, two voltage detecting sections are provided. That is, the first voltage detector 31 connected to the first wire pair and the second voltage detector 32 connected to the second wire pair are provided. The first voltage detector 31 is connected with the equalizing switch 221, while on the other hand, the second voltage detector 32 is not connected with the equalizing switch 221. Accordingly, the second voltage detector 32 can detect the terminal voltage of the unit cell V regardless of whether the equalizing switch 221 is on or off. The resistance of the connection path 23 of the unit cell V can be determined based on the difference between the voltage detected when the equalizing switch 221 is on and the voltage detected when the equalizing switch 221 is off.

In the example of FIG. 2, there is obtained, using the second voltage detector 32, the voltage difference $\Delta V$ ($=V1-V2$) between a first voltage detection value V1 detected when the equalizing switch 221 parallel-connected to the unit cell Va is off and a second voltage detection value V2 detected when this equalizing switch 221 is on. Subsequently, the resistance of the connection path 23 of the unit cell Va is calculated based on this voltage difference $\Delta V$. This resistance may be calculated using a map showing a relationship between the voltage difference $\Delta V$ and the resistance. Such a map may be stored in the ROM of the control section 25.

Next, the resistance detecting process performed by the battery monitoring apparatus 20 having the above described structure is explained. The resistance detecting process is performed at a predetermined period for each of the unit cells V.

This process begins in step S11 where it is determined whether or not it is time to perform the resistance detecting process. In this example, it is determined that it is time to perform the resistance detecting process if the battery pack 10 is connected to the battery monitoring apparatus 20, and a not-shown system main relay is off. This is because the resistance detecting process can be performed while suppressing the noise due to charge/discharge of the battery pack 10 if the system main relay is off.

If the determination result in step S11 is affirmative, the process proceeds to step S12 where it is determined whether any of the unit cells V have not yet been subjected to the resistance detecting process. If the determination result in step S12 is affirmative, i.e. some unit cells have not had their resistances checked, the process proceeds to step S13 where the equalizing switch 221 connected to the unit cell V which has not yet been subjected to the resistance detecting process is turned off, and the terminal voltage of this unit cell V is detected using the second voltage detector 32. As a result, the first voltage detection value V1 is obtained.

Figure 4:
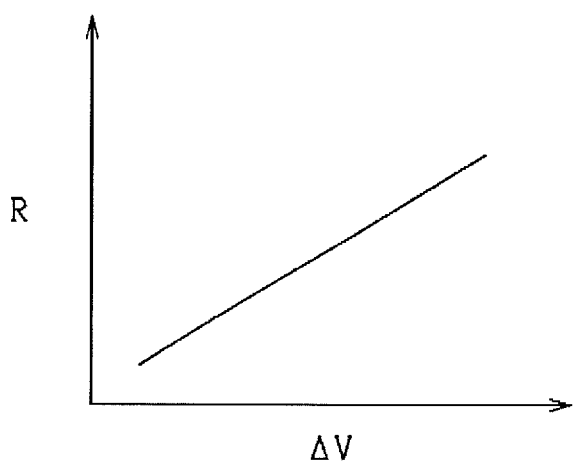
FIG. 4 is a diagram showing a relationship between a resistance and a voltage of a connection path between the battery pack and the battery monitoring apparatus.

In step S14, the equalizing switch 221 connected to this unit cell V is turned on, and the terminal voltage is detected using the second voltage detector 32. As a result the second voltage detection value V2 is obtained. In subsequent step S15, the voltage difference $\Delta V$ between the first voltage detection value V1 and the second voltage detection value V2 is calculated. In subsequent step S16, the resistance of the connection path of this unit cell V is calculated from the voltage difference $\Delta V$. In this embodiment, the resistance of the connection path 23 is calculated using the map which shows a relationship between the voltage difference ΔV and the resistance of the connection path 23 of the unit cell V as shown in FIG. 4.

In subsequent step S17, it is determined whether or not the calculated resistance of the connection path 23 is smaller than a first threshold value α1. The first threshold value α1 is set to the resistance of the connection path 23 of the unit cell 23 with no deterioration.

If the determination result in step S17 is affirmative. the process proceeds to step S18 where a determination that the connection path 23 is normal is made. That is, it is determined in step S18 that the resistance of the connection path 23 is within an allowable range. In this case, the equalizing process is performed as necessary in accordance with the voltage detection value obtained by the first voltage detector 31.

On the other hand, if the determination result in step S17 is negative, the process proceeds to step S19 where it is determined whether or not the calculated resistance of the connection path 23 is larger than or equal to the first threshold value α1 and smaller than a second threshold value α2 (α1<α2). If the determination result in step S19 is affirmative, the process proceeds to step S20 where the equalizing process is performed based on the corrected voltage which is equal to the voltage detection value detected by the first voltage detector 31 minus the voltage drop in the connection path 23.

On the other hand, if the determination result in step S19 is negative, the process proceeds to step S21 where an abnormality warning process is performed. For example, information to the effect that there is abnormality in the connection path 23 is notified to a higher system, or displayed on a display unit, or indicated by a speaker unit. If the determination result in step S11 or S12 is negative, this resistance detecting process is terminated.

Next, an example of the resistance detecting process is explained with reference to FIG. 2. The resistance detecting process is performed if there is the unit cell V not yet subjected to this process in the state where the battery pack 10 is connected to the battery monitoring apparatus 20, and the system main relay is off.

If it is determined that the unit cell Va has not yet been subjected to the resistance detecting process, the terminal voltage (V1) of the unit cell Va is detected using the second voltage detector 32 with the equalizing switch 221 parallel-connected to the unit cell Va being turned off. Thereafter, the equalizing switch 221 is turned on, and the terminal voltage (V2) of the unit cell Va is detected using the second voltage detector 32 in the state where a voltage drop is occurred by the resistance R2 when a current Ia flows through the connection path 23. The resistance R2 of the connection path 23 of the unit cell Va is calculated based on the voltage difference ΔV (=V1−V2). An abnormality determination is made depending on the value of the calculated resistance R2.

The embodiment described above provides the following advantages.

The terminal voltage of each unit cell V can be obtained when the equalizing switch 221 is on and when the equalizing switch 221 is off. The voltage detecting process and the equalizing process can be performed appropriately based on the voltage difference between the terminal voltage obtained when the equalizing switch 221 is on and the terminal voltage obtained when the equalizing switch 221 is off.

The equalizing process can be performed appropriately based on the voltage detected by the first voltage detector 31 provided between the first wire pair. It is possible to appropriately check deterioration of the connection path 23 based on the voltage detected by the second voltage detector 32 provided between the second wire pair.

It is possible to calculate the resistance of the connection path 23 based on the difference between the voltage detected by the second voltage detector 32 when the equalizing switch 221 is off and the voltage detected by the second voltage detector 32 when the equalizing switch 221 is on.

It is possible to determine whether an abnormality (an increase of the resistance) is present in the connection path 23. If the resistance of the connection path 23 is larger than or equal to the predetermined value, it can be determined that an abnormality is present in the connection path 23.

If the resistance of the connection path 23 is smaller than the predetermined value, it can be determined that the connection path 23 is normal.

The equalizing process is performed in accordance with the detected terminal voltage minus the voltage drop in the connection path 23 when the resistance of the connection path 23 is larger than or equal to the first threshold value α1 and smaller than the second threshold value α2. That is, when the resistance of the connection path 23 is within the predetermined range, the equalizing process can be performed appropriately using the corrected voltage.

If it is determined that an abnormality is present in the connection path 23, information to that effect is notified. Such information may be sent to a higher system, or notified to the user.

It is a matter of course that various modifications can be made to the above described embodiment.

Figure 3:
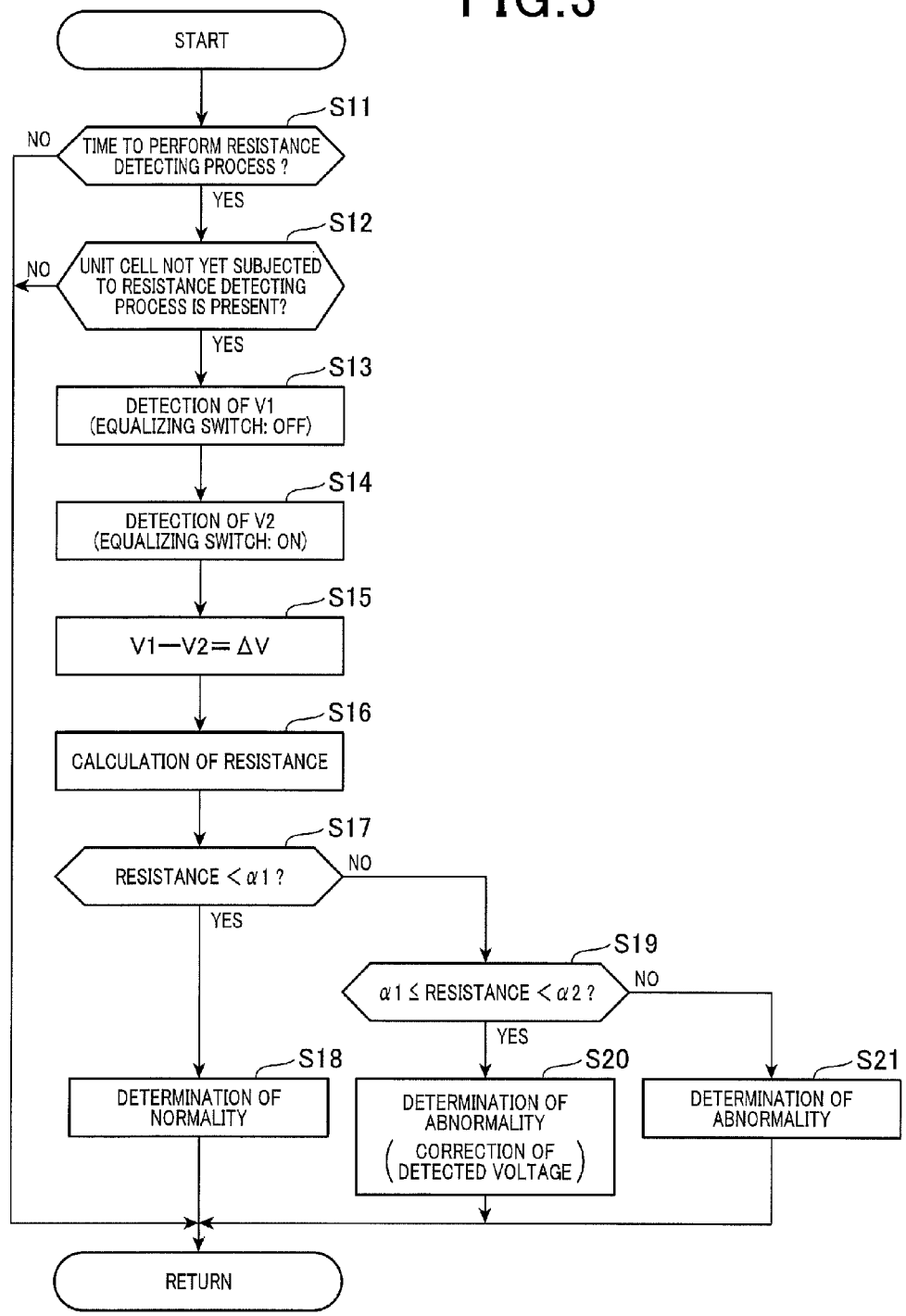
FIG. 3 is a flowchart showing steps of a resistance detecting process performed by the battery monitoring apparatus.

In the process shown in FIG. 3, a plurality of threshold values (the first threshold value α1 and the second threshold value α2) are used to determine whether the connection path 23 is normal or not. However, it is possible to determine whether the connection path 23 is normal or not by use of only one threshold value. In this case, the connection path 23 is determined to be normal if the voltage difference ΔV is smaller than a threshold value, and determined to be abnormal if the voltage difference ΔV is larger than or equal to the threshold value.

The above embodiment may be modified to determine which of the positive side and the negative side of the connection path 23 is abnormal when the connection path 23 is determined to be abnormal. For example, it is possible to determine which of the positive side and the negative side of the connection path 23 (the wire L1 and the connector CN) which are respectively connected to the positive electrode and the negative electrode of the unit cell V has increased in resistance by comparing the voltage differences ΔV of the adjacent unit cells V.

The above embodiment may be modified to perform the resistance detecting process at the time of performing the equalizing process. In this case, the steps of the resistance detecting process performed by the control section 25 can be simplified, and the battery pack 10 can be used more efficiently.

In the above embodiment, the resistance detecting process is performed while the system main relay is off. However, the resistance detecting process may be performed when the system main relay is on during a period in which the battery pack 10 is not being charged or discharged, or only slightly charged or discharged, for example, while the vehicle is parked.

The above explained preferred embodiments are exemplary of the invention of the present application which is described solely by the claims appended below. It should be understood that modifications of the preferred embodiments may be made as would occur to one of skill in the art.

What is claimed is:

1. A battery monitoring apparatus for a battery pack including a plurality of unit cells connected in series, comprising:
   a plurality of wire groups each of which is connected to a node between a corresponding adjacent two of the unit cells at one end thereof, and branched into a first branch and a second branch at another end thereof, each of the first and second branches being constituted of a positive part connected to a positive electrode of a corresponding one of the unit cells and a negative part connected to a negative electrode of the corresponding one of the unit cells, for each of the wire groups:
      the positive part of the second branch and the negative part of the first branch constitute a first wire pair, and the positive part of the first branch and the negative part of the second branch constitute a second wire pair;
   an equalizing switch provided between each of the first wire pairs to short-circuit its first wire pair when turned on;
   a first voltage detector provided in parallel to each of the equalizing switches to detect a voltage between a corresponding one of the first wire pairs;
   an equalizing circuit which performs an equalizing process to equalize a terminal voltage of each unit cell by turning on a corresponding one of the equalizing switches depending on a result of voltage detection by the first voltage detector;
   a second voltage detector provided between each of the second wire pairs for detecting the terminal voltage of a corresponding one of the unit cells when the equalizing switch is on and when the equalizing switch is off; and
   a processor configured to:
      calculate a resistance for each of the wire groups based on a difference between a first voltage detection value detected by the second voltage detector when the equalizing switch is on and a second voltage detection value detected by the second voltage detector when the equalizing switch is off;
      determine for each of the wire groups that there is an abnormality in the wire group if the calculated resistance exceeds a first threshold value; and
      correct the voltage detected by the first voltage detector if the calculated resistance is larger than the first threshold value and smaller than a second threshold value which is larger than the first threshold value.

2. The battery monitoring apparatus according to claim 1, wherein the processor is further configured to determine whether or not each of the wire groups has been deteriorated based on the first voltage detection value and the second voltage detection value.

3. The battery monitoring apparatus according to claim 1, wherein the equalizing circuit performs the equalizing process in accordance with the voltage corrected by the processor.

4. The battery monitoring apparatus according to claim 1, wherein the processor is further configured to identify, for each of the wire groups, which of the positive part and the negative part has increased in resistance based on resistance values of two adjacent wire groups.

5. The battery monitoring apparatus according to claim 1, wherein the processor is further configured to make notification that the resistance calculated by the processor exceeds a predetermined value.

6. The battery monitoring apparatus according to claim 1, further comprising an RC filter provided in each of the first wire pairs.

* * * * *